US 6,700,453 B2

(12) United States Patent
Heiskala et al.

(10) Patent No.: US 6,700,453 B2
(45) Date of Patent: Mar. 2, 2004

(54) AMPLITUDE IMBALANCE COMPENSATION OF QUADRATURE MODULATOR

(75) Inventors: Juha Heiskala, Irving, TX (US); Lauri Kuru, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/173,574

(22) Filed: Jun. 18, 2002

(65) Prior Publication Data

US 2003/0231075 A1 Dec. 18, 2003

(51) Int. Cl.⁷ ................................................. H03K 3/00

(52) U.S. Cl. ....................................... 332/103; 332/105

(58) Field of Search ............................. 332/103–105, 332/149–153

(56) References Cited

U.S. PATENT DOCUMENTS

| | | | |
|---|---|---|---|
| 4,890,301 A | 12/1989 | Hedberg | 375/296 |
| 4,930,141 A | 5/1990 | Ohmagari | |
| 4,930,151 A | 5/1990 | Walton et al. | 379/93.14 |
| 5,012,208 A | 4/1991 | Makinen et al. | 332/103 |
| 5,054,037 A | 10/1991 | Martineau et al. | 375/296 |
| 5,119,399 A | 6/1992 | Santos et al. | 375/224 |
| 5,293,406 A | 3/1994 | Suzuki | 375/295 |
| 5,355,101 A | 10/1994 | Ichihara et al. | 332/103 |
| 5,367,271 A | 11/1994 | Yamamoto et al. | 332/105 |
| 5,369,411 A | 11/1994 | Lisle, Jr. | 342/194 |
| 5,663,691 A | 9/1997 | Kowalik et al. | |
| 5,847,619 A | 12/1998 | Kirisawa | 332/103 |
| 5,883,551 A | 3/1999 | Marchesani et al. | 332/103 |
| 6,208,698 B1 | 3/2001 | Marchesani et al. | 375/298 |
| 6,298,096 B1 | 10/2001 | Burgin | 375/296 |
| 6,307,902 B1 | 10/2001 | Walley | 375/345 |
| 6,421,398 B1 * | 7/2002 | McVey | 375/308 |

FOREIGN PATENT DOCUMENTS

WO    WO 01/89169    11/2001

OTHER PUBLICATIONS

Lohtia et al., "An Adaptive Digital Technique for Compensating For Analog Quadrature Modulator/Demodulator Impairments," 0–7803–0971–5/93, 1993 IEEE, pp. 447–450.

"Automatic Adjustment of Quadrature Modulators," Electronics Letters, 31$^{st}$ Jan. 1991, vol. 27, No. 3, pp. 214–216.

Marchesani, "Digital Precompensation of Imperfections in Quadrature Modulators," IEEE Transactions on Communications, vol. 48, No. 4, Apr. 2000, pp. 552–556.

Cavers, "New Methods for Adaptation of Quadrature Modulators and Demodulators in Amplifier Linearization Circuits," IEEE Transactions on Vehicular Technology, vol. 46, No. 3, Aug. 1997, pp. 707–716.

(List continued on next page.)

Primary Examiner—Kenneth B. Wells
(74) Attorney, Agent, or Firm—Pillsbury Winthrop LLP

(57) ABSTRACT

A method and an arrangement for compensating for amplitude imbalance of a quadrature modulator including: determining a first correlation on the basis of a first modulation signal and an output signal of the quadrature modulator; determining a second correlation on the basis of a second modulation signal and the output signal of the quadrature modulator; producing a compensation signal proportional to the amplitude imbalance on the basis of a ratio of the determined correlations and the first and second modulation signals; and processing at least one of the modulation signals of the quadrature modulator with the compensation signal; wherein determining the correlations uses unprocessed modulation signals of the quadrature modulator for determining the correlations.

23 Claims, 1 Drawing Sheet

OTHER PUBLICATIONS

Cavers, "The Effect of Quadrature Modulator and Demodulator Errors on Adaptive Digital Predistorters for Amplifier Linearization," IEEE Transactions on Vehicular Technology, vol. 46, No. 2, May 1997, pp. 456–466.

Yang et al., "I/Q Modulator Image Rejection Through Modulation Pre–distortion," 0–7803–3157–5/96, IEEE 1996, pp. 1317–1320.

Sundstrom, "Automatic adjustment of gain and phase imbalances in LINC transmitters," Electronics Letters, Feb. $2^{nd}$ 1995, vol. 31, No. 3, pp. 155–156.

Hilborn et al., "An Adaptive Direct Converison Transmitter," IEEE Transactions on Vehicular Technology, vol. 43, No. 2, May 1994, pp. 223–233.

Cavers et al., "Adaptive Compensation for Imbalance and Offset Losses in Direct Conversion Transceivers," IEEE Transactions on Vehicular Technology, vol. 42, No. 4, Nov. 1993, pp. 581–588.

\* cited by examiner

AMPLITUDE IMBALANCE COMPENSATION OF QUADRATURE MODULATOR

FIELD OF THE INVENTION

The invention relates to quadrature modulators, and more particularly to the compensation of quadrature modulator amplitude imbalance.

BACKGROUND OF THE INVENTION

Quadrature carrier transmitters use both inphase (I) and quadrature-phase (Q) carriers to transmit information. Quadrature modulation is required to upconvert the information bearing I- and Q-signals to an intermediate frequency (IF) or directly to the carrier frequency (direct conversion), depending on the structure of the transmitter radio frequency (RF) chain. A quadrature modulator operates on a quadrature modulation basis. It enables two independent signals to be combined in the transmitter and be transmitted on the same transmission band and the signals to be separated again at the receiver. The principle of quadrature modulation is that two separate signals, I and Q (Inphase and Quadrature phase), are modulated by using the same carrier wave frequency, but the phases of the carrier waves differ from each other in that the carrier wave of signal Q lags 90° behind the carrier wave of signal 1. After modulation, the signals are summed. Thanks to the phase difference, the I- and Q-signals can be separated from each other when the sum signal is demodulated. When the quadrature modulation is implemented with analog components several distortions can affect the quality of the transmitted signal. The most common distortions are generally described as local oscillator or carrier leakage, quadrature phase error and amplitude imbalance. The distortions cause e.g. errors in the mutual phase and amplitude balance of the I- and Q-signals.

Semiconductor manufacturing processes do not produce perfect analog components. When a large amount of products are produced, there are always some variations in component values. If these variations are left uncorrected the quality of the transmitted signal will degrade and possibly not reach a level required by standards. This degradation can be mitigated in two ways, either by improving the manufacturing process, or by compensating the degradation in each individual product by using signal processing methods. Improving manufacturing process is expensive for large product quantities, generally more lax manufacturing specifications result in cost reductions, and hence more competitive product. Therefore signal processing methods are preferable as a method to compensate component value variations. Additionally quadrature modulator errors depend on temperature, aging, and carrier frequency. These effects are very difficult to compensate with the analog design of the quadrature modulator.

Correction circuits with fixed correction parameters set therein have been used for correcting the distortions caused by the quadrature modulator. The problem is then manufacturability, since each quadrature modulator requires unique parameters, which must be set as early as during the production. In addition, as already stated above, the magnitude of the amplitude imbalance caused by the quadrature modulator depends on the frequency, in which case when the frequency is changed, the fixedly-set correction does not necessarily work any longer. Therefore adaptive signal processing techniques are very desirable methods to correct the distortions. Various adaptive techniques for compensating the amplitude imbalance caused by the quadrature modulator are also known. Often these techniques, however, require the use of a special training signal and/or are dependent on knowing the quadrature transmitter chain gain, the exact value of which can vary from device-specifically.

BRIEF DESCRIPTION OF THE INVENTION

An object of the present invention is thus to provide a method and an arrangement for compensating for an amplitude imbalance of a quadrature modulator such that no special training signal is needed. It is another object of the invention to provide a method and an arrangement for compensating for an amplitude imbalance of a quadrature modulator such that they are independent of the transmitter chain gain.

The objects of the invention are achieved by a method for compensating an amplitude imbalance of a quadrature modulator comprising: determining a first correlation on the basis of a first modulation signal and an output signal of the quadrature modulator; determining a second correlation on the basis of a second modulation signal and the output signal of the quadrature modulator; producing a compensation signal proportional to the amplitude imbalance on the basis of a ratio of the determined correlations and the first and second modulation signals; and processing at least one of the modulation signals of the quadrature modulator with the compensation signal; wherein the correlations are determined on the basis of unprocessed modulation signals of the quadrature modulator.

The objects of the invention are further achieved by an arrangement for compensating for amplitude imbalance of a quadrature modulator comprising: means for determining a first correlation on the basis of a first modulation signal and an output signal of the quadrature modulator; means for determining a second correlation on the basis of a second modulation signal and the output signal of the quadrature modulator; means for producing a compensation signal proportional to the amplitude imbalance on the basis of a ratio of the determined correlations and the first and second modulation signals; and means for processing at least one of the modulation signals of the quadrature modulator with the compensation signal; wherein the means for determining the correlations are arranged to use unprocessed modulation signals of the quadrature modulator for determining the correlations.

The objects of the invention are further achieved by an arrangement for compensating for amplitude imbalance of a quadrature modulator comprising: a first correlator configured to determine a first correlation on the basis of a first modulation signal and an output signal of the quadrature modulator; a second correlator configured to determine a second correlation on the basis of a second modulation signal and the output signal of the quadrature modulator; means configured to produce a compensation signal proportional to the amplitude imbalance on the basis of a ratio of the determined correlations and the first and second modulation signals; and means configured to process at least one of the modulation signals of the quadrature modulator with the compensation signal; wherein the first and second correlators are configured to use unprocessed modulation signals of the quadrature modulator for determining the correlations.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
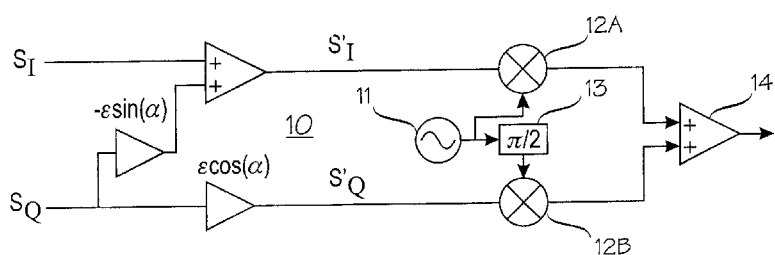
FIG. 1 is a block diagram of the basic structure of a quadrature modulator illustrating also a model of the distortions caused by amplitude and phase imbalance.

FIG. 1 shows a baseband model of the distortion caused by amplitude and phase imbalance in a quadrature modulator 10 and the basic structure of the quadrature modulator. The modulator 10 comprises two mixers 12A and 12B, both of them comprising a modulation input, a local oscillator input and a high frequency output. To the mixer 12A is fed a modulation signal $S_I'$ as well as a local oscillator signal from a local oscillator 11. A modulation signal $S_Q'$ is fed to the mixer 12B in a corresponding way, but a local oscillator signal is fed to the mixer 12B through a phase shift means 13 in a 90 degree phase shift with respect to the local oscillator signal fed to the mixer 12A. The high frequency outputs of the mixers 12A and 12B are connected to an adder element 14 combining the modulated high frequency signals into one high frequency signal to be transmitted forward, which signal is fed to the output of the adder element 14. QPSK modulation is a typical modulation method carried out by means of a quadrature modulator of this kind. It should be noted that the present invention is not limited to any particular system or modulation method but can be used in various systems including not only single carrier but also multicarrier systems such as Orthogonal Frequency Division Multiplexing (OFDM). It should also be noted that the Figures illustrate only components that are necessary for the understanding of the invention.

Figure 2:
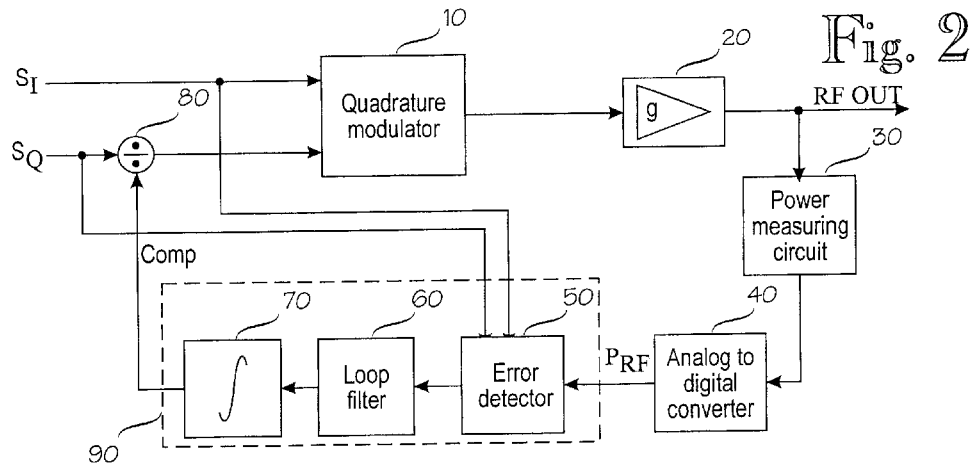
FIG. 2 is a block diagram of an amplitude imbalance correction arrangement according to an embodiment of the invention.

FIG. 2 shows the basic structure of an amplitude imbalance correction loop according to one embodiment of the invention. In the figure, I- and Q-modulation signals $S_I$ and $S_Q$ are supplied to the quadrature modulator 10. Compensation for the amplitude imbalance according to compensation signal COMP is carried out at a signal processing unit 80, in this example a divider, connected in front of a modulation signal $S_Q$ input of the quadrature modulator 10. It should be noted that the amplitude imbalance compensation could alternatively be implemented by processing modulation signal $S_I$ or both of the modulation signals $S_Q$ and $S_I$. The modulation signals are then conveyed to the quadrature modulator 10. The modulated signal is typically supplied to one or more power amplifiers 20 having a gain 9 and further to be transmitted RF OUT. Simultaneously, feedback is formed by means of a sampling arrangement 30 measuring the power of the output signal RF OUT and producing a feedback signal $P_{RF}$, such as voltage, proportional to the power of the output signal. The power measuring circuit 30 can be based on a simple diode RF envelope detector, for example.

The feedback signal $P_{RF}$ is preferably converted to digital form by an A/D converter 40 for digital processing. It should be noted that also analog processing could be used. The feedback signal $P_{RF}$ is then conveyed to a block 90, which generates the compensation signal COMP, for further processing. Also the modulation signals $S_I$ and $S_Q$ (that have not been processed by the signal processing unit 80) are conveyed to the compensation signal production block 90 for further processing. The operation of the compensation signal producing block 90 is explained in more detail in the following. According to the example illustrated in FIG. 2 the compensation signal producing block 90 comprises an error detector unit 50, a loop filter 60 and an integrator 70. The error detector unit 50 as well as the loop filter 60, the integrator 70, and the signal processing unit 80 can be implemented either by software in a suitable signal processing apparatus such as a general purpose digital signal processor (or several processors) or by hardware by using a specific integrated circuit (or circuits), for example.

The quadrature modulator 10 in FIG. 2 is assumed to have both phase and amplitude imbalance. A general quadrature modulator would also have carrier leakage, or DC bias errors. These impairments can be corrected independently of the quadrature phase and/or amplitude imbalance, for example with the method presented in U.S. Pat. No. 5,012,208, incorporated herein as a reference, and hence the quadrature modulator 10 is assumed to have no carrier leakage errors.

If the quadrature modulator 10 were operating perfectly, the RF out signal $S_{RF}$ would be:

$$S_{RF}=g[S_I \cos(\Omega_{LO}t)-S_Q \sin(\Omega_{LO}t)] \quad (1)$$

When the quadrature modulator 10 has both phase and amplitude imbalance the RF signal is (see FIG. 1):

$$S_{RF}=g[(S_I-\epsilon \sin(\alpha)S_Q)\cos(\Omega_{LO}t)-\epsilon \cos(\alpha)S_Q \sin(\Omega_{LO}t)], \quad (2)$$

where:

$S_I$=baseband I modulation signal;
$S_Q$=baseband Q modulation signal;
$\epsilon$=amplitude imbalance;
$\alpha$=phase imbalance;
g=transmitter chain gain; and
($\Omega_{LO}$=carrier frequency.

Equation (2) shows how phase imbalance introduces cross interference between I- and Q-modulation signals, and additionally distorts the amplitude of the Q-signal. Amplitude imbalance distorts the amplitude of the Q-signal.

The quadrature modulator errors manifest themselves only after the baseband signal has been upconverted to the carrier frequency. Since it may be difficult to measure the exact value of the RF signal RF OUT, it is preferable to use the power, which can be measured relatively easily, of the RF signal as an indicator of the quadrature modulator 10 errors. The power measuring circuit 30 can be built with a simple diode component, hence the arrangement can be implemented at low cost. Equation (3) shows the power of the RF signal with phase and amplitude imbalance.

$$P_{RF}=g^2[S_I^2-2\epsilon \sin(\alpha)S_I S_Q+\epsilon^2 S_Q^2] \quad (3)$$

According to the invention the compensation signal producing block 90 produces a compensation signal COMP that is proportional to the amplitude imbalance. Additionally it is preferable that the operation of the compensation signal producing block 90 does not depend on the transmitter gain g, and the phase imbalance α to achieve robust operation.

According to an embodiment of the invention the compensation signal producing block 90 comprises an error detector unit 50 which produces an error signal $error_\epsilon$. Preferably the value of the error signal $error_\epsilon$ is equal to zero when there is no amplitude imbalance, i.e. the amplitude imbalance of the quadrature modulator 10 is perfectly compensated (or the quadrature modulator 10 does not have any amplitude imbalance). Developing an error detector that relies only on the RF signal envelope power measurement and does not require known test signals is a challenging task. This can be seen from equation (3) that has three unknown variables g, α, and ε. It is impossible to solve the equation with three unknown variables from one measurement directly. It is possible to take several measurements at different time instants for different values of the baseband signals and form a system of equations to solve the parameters. However, the feasibility of this approach is dependent on the baseband signal values, and it is not guaranteed that the system of equations is solvable. Therefore an indirect method is presented next.

Figure 4:
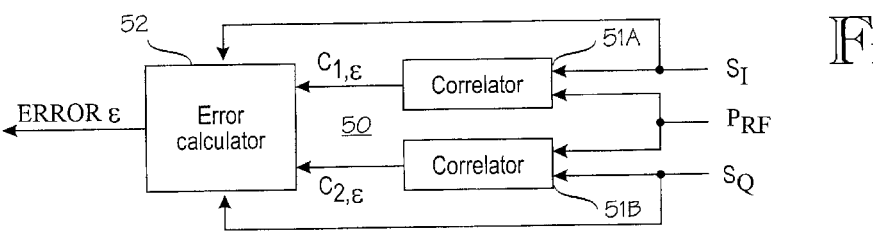
FIG. 4 is a block diagram of the structure of the error detector according to an embodiment of the invention.

The control loop in FIG. 2 operates as a low-pass filter, and hence it is possible to use expected values of signals in the error detector 50. Although exact values of the expected values of signals could be determined, in practice an adequate accuracy is achieved by determining mean values of the signals and by using them instead. The structure of the error detector 50 is illustrated in more detail in FIG. 4. The error detector 50 uses two correlators 51A and 51B to remove the effect phase imbalance and the transmitter gain from the estimated error. The first correlator is preferably defined as:

$$C_{1,\epsilon} = E[P_{RF}S_I^2] = g^2 E[S_I^2 - 2\epsilon \sin(\alpha) S_I S_Q S_I^2 + \epsilon^2 S_Q^2 S_I^2] \quad (4)$$

and the second correlator is preferably defined as:

$$C_{2,\epsilon} = E[P_{RF}S_Q^2] = g^2 E[S_I^2 S_Q^2 - 2\epsilon \sin(\alpha) S_I S_Q S_Q^2 + \epsilon^2 S_Q^{2} S_Q^2] \quad (5)$$

Thus preferably a correlation between the power of the output signal and square of the first modulation signal and a correlation between the power of the output signal and square of the second modulation signal are used in the implementation of the invention. However, also other correlations determined on the basis of the first modulation signal and the output signal and on the basis of the second modulation signal and the output signal and indicating the correlation between the output signal and the corresponding modulation signals could be used without deviating from the basic idea of the invention. Next it is assumed that the expected value of odd powered terms of the baseband signals $S_I$ and $S_Q$ are equal to zero. This assumption is justified by noting the baseband signals are zero mean random variables. A second assumption is that the baseband signals are independent random variables, this is usually true for practical communications systems. With these assumptions equations (4) and (5) simplify to:

$$C_{1,\epsilon} = E[P_{RF}S_I^2] = g^2 (E[S_I^4] + \epsilon^2 E[S_I^2]E[S_Q^2]) \quad (6)$$

and $$C_{2,\epsilon} = E[P_{RF}S_Q^2] = g^2 (E[S_I^2]E[S_Q^2] + \epsilon^2 E[S_Q^4]) \quad (7)$$

respectively. The effect of the phase imbalance α has been removed from the equations (6) and (7). The next step is to remove the effect of the transmitter gain g. This is achieved by calculating the ratio R of the two correlator values.

$$R = \frac{C_{1,\epsilon}}{C_{2,\epsilon}} = \frac{g^2[E[S_I^4] + \epsilon^2 E[S_I^2]E[S_Q^2]]}{g^2[E[S_I^2]E[S_Q^2] + \epsilon^2 E[S_Q^4]]} = \frac{E[S_I^4] + \epsilon^2 E[S_I^2]E[S_Q^2]}{E[S_I^2]E[S_Q^2] + \epsilon^2 E[S_Q^4]} \quad (8)$$

The value of the amplitude imbalance ε can be solved from equation (8).

$$\epsilon^2 = \frac{R E[S_I^2]E[S_Q^2] - E[S_I^4]}{E[S_I^2]E[S_Q^2] - R E[S_Q^4]} \quad (9)$$

The final step is to calculate the error detector 50 output value $error_\epsilon$ that is proportional to the amplitude imbalance and is equal to zero when there is no amplitude imbalance i.e. ε=1.

$$error_\epsilon = \sqrt{\epsilon^2} - 1 = \sqrt{\frac{R E[S_I^2]E[S_Q^2] - E[S_I^4]}{E[S_I^2]E[S_Q^2] - R E[S_Q^4]}} - 1 \quad (10)$$

Equation (10) is the output of the error detector in FIG. 2. To sum up and referring to FIG. 4, the error detector 50 preferably operates in the following way: correlators 51A and 51B calculate the correlations between the feedback signal $P_{RF}$ and squares of the modulation signals 52 and $S_Q^2$ respectively. Correlation results $C_{1,\epsilon}$ and $C_{2,\epsilon}$ as well as the modulation signals $S_I$ and $S_Q$ are conveyed to an error calculator block 52, which calculates the error signal error, on the basis of the correlation results $C_{1,\epsilon}$ and $C_{2,\epsilon}$ and the modulation signals $S_I$ and $S_Q$ e.g. according to equation (10).

This error detector 50 operates correctly as long as the denominator in equation (10) is not equal to zero. This would happen if the expected value of the fourth power of the baseband signal is equal to the square of the expected value of square of the baseband signals, as shown in equation (11).

$$E[S_I^2]^2 = E[S_I^4]$$

$$E[S_Q^2]^2 = E[S_Q^4] \quad (11)$$

This condition is usually not true for a practical communications signal. Statistics of a random variable change when it is raised to various powers as long as the random variable has amplitude variations, especially multicarrier systems have large amplitude variations in the baseband signals.

The error signal error, is then preferably filtered in a loop filter block 60. After filtering, the error signal $error_\epsilon$ is integrated over time in an integrator block 70. The integration result of the error signal $error_\epsilon$ is the compensation signal COMP.

The actual correction of the amplitude imbalance is done by dividing the baseband Q modulation signal by the compensation signal COMP prior to conveying it to the quadrature modulator 10 (or by multiplying by an inverse value of COMP) in the signal processing unit 80.

Figure 3:
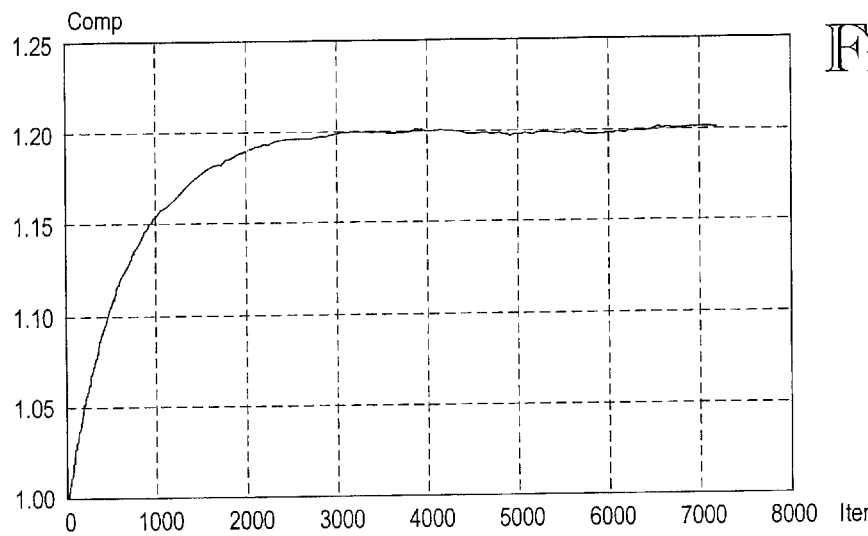
FIG. 3 shows a simulation example of the convergence of the amplitude imbalance loop.

Thus the amplitude imbalance correction loop illustrated in FIG. 2 will iteratively find the amplitude imbalance of quadrature modulator 10 by gradually increasing or decreasing the value of the compensation signal COMP on the basis of the error signal errorϵ until the compensation signal COMP corresponds to the amplitude imbalance E. When the amplitude imbalance is perfectly compensated and the value of the error signal equals to zero, the value of the compensation signal COMP does not change anymore except when the amplitude imbalance of quadrature modulator 10 changes. In a perfect balance-situation when the value of the compensation signal COMP equals to the amplitude imbalance E the amplitude imbalance is perfectly compensated i.e. division of the modulation signal $S_Q$ by COMP $(=\epsilon)$ results (referring to FIG. 1): $S'_Q=\cos(\alpha)S_Q$ and $S'_I=S_I-\sin(\alpha)S_Q$. Terms $\cos(\alpha)$ and $\sin(\alpha)$ depend on phase imbalance, which has not been corrected. After correcting the phase-imbalance, modulator input signal is free of errors, that is $S'_Q=S_Q$ and $S'_I=SI$. In practice a perfect balance is not necessarily obtained but a small ripple around the correct value of the compensation signal COMP may occur. This, however, is usually negligible. FIG. 3 shows a simulation example of the convergence of the amplitude imbalance loop and the compensation signal COMP to the correct value 1.2 when the value of the amplitude imbalance $\epsilon$ is 1.2. The system has also a 10 degree phase imbalance that is not corrected, so the simulation verifies the theoretical independence of the amplitude imbalance error compensation, performed according to the invention, of the phase imbalance.

The amount of ripples in the estimated error around the correct value can be controlled with a loop filter 60; a narrow loop filter reduces ripples, but slows convergence and vice versa. It is possible to control the loop filter 60 adaptively, initially, when the amplitude imbalance is great, to speed up convergence and then reduce the ripples, once the loop has converged close to the correct value. According to an embodiment of the invention the gain factor of the filter 60 is adjusted according to the amount of amplitude imbalance.

Each of the individual blocks in the system of FIG. 2 can be optimized for hardware implementation. The power measuring circuit 30 can be implemented with a simple diode component. The analog to digital converter 40 has no special requirements, other than fast enough sampling speed relative to the bandwidth of the RF signal.

The error detector 50 can be implemented either in software or hardware. For hardware implementation it is preferable to remove the square root and division operations. The square root can be simply discarded, because the error value converges to one, and square root of one is equal to one. Therefore the loop converges to the correct value without the square root operation in equation (10):

$$error_\epsilon = \epsilon^2 - 1 = \frac{R\, E[S_I^2]E[S_Q^2] - E[S_I^4]}{E[S_I^2]E[S_Q^2] - R\, E[S_Q^4]} - 1 \qquad (12)$$

The division operations in calculation of the ratio R of the two correlators, equation (8), and the error value, equations (10) and (12), can be removed by the following changes of the analysis. The error calculation is equal to equation (12), and $\epsilon^2$ is a positive number, hence we can take absolute values:

$$error_\epsilon = \frac{|R\, E[S_I^2]E[S_Q^2] - E[S_I^4]|}{|E[S_I^2]E[S_Q^2] - R\, E[S_Q^4]|} - 1 \qquad (13)$$

and then multiply by the denominator:

$$|E[S_I^2]E[S_Q^2] - RE[S_Q^4]| \cdot error_\epsilon = |RE[S_I^2]E[S_Q^2] - E[S_I^4]| - |E[S_I^2][S_Q^2] - RE[S_Q^4]| \qquad (14)$$

Next replace $R=C_1/C_2$ and multiply by $C_2$:

$$|C_2E[S_I^2]E[S_Q^2] - C_1E[S_Q^4]| \cdot error_\epsilon = |C_1E[S_I^2]E[S_Q^2] - C_2E[S_I^4]| - |C_2E[S_I^2]E[S_Q^2] - C_1E[S_Q^4]| \qquad (15)$$

Now the error on the left hand side has a variable gain term, this effectively only changes the gain of the loop filter 60. If the loop filter 60 is designed to work correctly with maximum gain possible, the overall operation of the loop is not affected unacceptably. Hence we can change the multiplier of the error term by gain $G_F$:

$$G_F \cdot error_\epsilon = |C_1E[S_I^2]E[S_Q^2] - C_2E[S_I^4]| - |C_2E[S_I^2]E[S_Q^2] - C_1E[S_Q^4]| \qquad (16)$$

With these adjustments the error detector 50 can be implemented without square root or division operations.

The next component in the system is the loop filter 60. The simplest method is to use a pure gain factor (gain <1) as the loop filter 60. This results in a simple low pass function when the control loop is closed. In hardware the gain factor can be implemented as powers of two $G_F=2^{-n}$ where n defines the actual gain. Using powers of two provides the benefit that the multiplication can be implemented as a simple shift of the binary representation of the input value.

The integrator component 70 is an ideal integrator, hence it is simple to implement in software or hardware. The ouput value of the integrator is equal to previous output added to the current input value.

Last operation is the actual correction of amplitude imbalance by dividing the Q baseband signal by the compensation signal COMP. This last division can be replaced by an approximation when the amplitude imbalance is close to one:

$$\frac{1}{COMP} \approx 2 - COMP$$

Hence, instead of dividing by the compensation signal value, the Q signal is multiplied by 2 minus the compensation signal value. This approximation is better the closer the compensation signal value is to one.

In the above described example it has been assumed that the I modulation signal $S_I$ is perfectly upconverted and the Q modulation signal $S_Q$ bears the imbalance. Consequently only signal $S_Q$ is compensated. However, the amplitude imbalance compensation could also be implemented by changing the roles of the modulation signals $S_I$ and $S_Q$ in the above example and compensate signal $S_I$ whereby the signal processing unit 80 would be located in front of the I modulation signal $S_I$ input of the quadrature modulator 10. It is also possible to use symmetrical compensation, whereby both the modulation signals $S_I$ and $S_Q$ are compensated, without deviating from the basic idea of the invention.

It will be obvious to a person skilled in the art that, as the technology advances, the inventive concept can be implemented in various ways. The invention and its embodiments are not limited to the examples described above but may vary within the scope of the claims.

What is claimed is:

1. A method for compensating for amplitude imbalance of a quadrature modulator comprising:
   determining a first correlation on the basis of a first modulation signal and an output signal of the quadrature modulator;
   determining a second correlation on the basis of a second modulation signal and the output signal of the quadrature modulator;
   producing a compensation signal proportional to the amplitude imbalance on the basis of a ratio of the determined correlations and the first and second modulation signals; and processing at least onewof the modulation signals of the quadrature modulator with the compensation signal;

wherein the correlations are determined on the basis of unprocessed modulation signals of the quadrature modulator.

2. The method of claim 1, wherein the output signal of the quadrature modulator used for determining the correlations is an amplified output signal.

3. The method of claim 1, wherein the first correlation is a correlation between power of the output signal and square of the first modulation signal and the second correlation is a correlation between power of the output signal and square of the second modulation signal.

4. The method of claim 1, wherein the production of the compensation signal comprises:

producing an error signal proportional to the amplitude imbalance on the basis of a ratio of the determined correlations and the first and second modulation signals; and producing the compensation signal on the basis of the error signal.

5. The method of claim 4, wherein the error signal is set to be equal to zero when there is no amplitude imbalance.

6. The method of claim 4 or 5, wherein the compensation signal is produced by integrating the error signal over time.

7. The method of claim 6, wherein the error signal is low pass filtered prior to integration.

8. The method of claim 7, wherein the error signal is filtered with a filter having a gain factor less than unity.

9. The method of claim 8, wherein the gain factor of the filter is adjusted according to the amount of amplitude imbalance.

10. The method of claim 1, wherein the processing of at least one of the modulation signals with the compensation signal is performed by dividing or multiplying at least one of the modulation signals with the compensation signal.

11. The method of claim 1, wherein the processing at least one of the modulation signals with the compensation signal is performed by dividing or multiplying at least one of the modulation signals with an approximation of the compensation signal.

12. An arrangement for compensating for an amplitude imbalance of a quadrature modulator comprising:

means for determining a first correlation on the basis of a first modulation signal and an output signal of the quadrature modulator;

means for determining a second correlation on the basis of a second modulation signal and the output signal of the quadrature modulator;

means for producing a compensation signal proportional to the amplitude imbalance on the basis of a ratio of the determined correlations and the first and second modulation signals; and means for processing at least one of the modulation signals of the quadrature modulator with the compensation signal;

wherein the means for determining the correlations are arranged to use unprocessed modulation signals of the quadrature modulator for determining the correlations.

13. The arrangement of claim 12, wherein the output signal of the quadrature modulator is an amplified output signal.

14. The arrangement of claim 12, wherein the first correlation is a correlation between power of the output signal and square of the first modulation signal and the second correlation is a correlation between power of the output signal and square of the second modulation signal.

15. The arrangement of claim 12, wherein the means for producing the compensation signal comprise:

means for producing an error signal proportional to the amplitude imbalance on the basis of a ratio of the determined correlations and the first and second modulation signals; and means for producing the compensation signal on the basis of the error signal.

16. The arrangement of claim 15, wherein the means for producing the error signal are arranged to set the error signal to be equal to zero when there is no amplitude imbalance.

17. The arrangement of claim 15 or 16, wherein the means for producing the compensation signal on the basis of the error signal are arranged to produce the compensation signal by integrating the error signal over time.

18. The arrangement of claim 17, wherein the arrangement comprises means for filtering the error signal connected between the means for producing the error signal and the means for producing the compensation signal on the basis of the error signal.

19. The arrangement of claim 18, wherein the means for filtering the error signal has a gain factor less than unity.

20. The arrangement of claim 19, wherein the arrangement is arranged to adjust the gain factor of the means for filtering the error signal according to the amount of amplitude imbalance.

21. The arrangement of claim 12, wherein the means for processing at least one of the modulation signals are arranged to divide or multiply at least one of the modulation signals with the compensation signal.

22. The arrangement of claim 12, wherein the means for processing at least one of the modulation signals are arranged to divide or multiply at least one of the modulation signals with an approximation of the compensation signal.

23. An arrangement for compensating for amplitude imbalance of a quadrature modulator comprising:

a first correlator configured to determine a first correlation on the basis of a first modulation signal and an output signal of the quadrature modulator;

a second correlator configured to determine a second correlation on the basis of a second modulation signal and the output signal of the quadrature modulator;

means configured to produce a compensation signal proportional to the amplitude imbalance on the basis of a ratio of the determined correlations and the first and second modulation signals; and means configured to process at least one of the modulation signals of the quadrature modulator with the compensation signal;

wherein the first and second correlators are configured to use unprocessed modulation signals of the quadrature modulator for determining the correlations.

* * * * *